United States Patent [19]
Eccleston et al.

[11] Patent Number: 5,446,371
[45] Date of Patent: Aug. 29, 1995

[54] PRECISION ANALOG-TO-DIGITAL CONVERTER WITH LOW-RESOLUTION AND HIGH-RESOLUTION CONVERSION PATHS

[75] Inventors: Larry E. Eccleston, Edmonds; David E. Bezold, Mukilteo, both of Wash.

[73] Assignee: Fluke Corporation, Everett, Wash.

[21] Appl. No.: 241,835

[22] Filed: May 12, 1994

[51] Int. Cl.6 ............................................. G01R 17/06
[52] U.S. Cl. .............................. 324/121 R; 324/99 D; 324/115; 341/131; 364/487
[58] Field of Search ............... 324/121 R, 99 D, 115; 364/487; 341/131

[56] References Cited

U.S. PATENT DOCUMENTS 4,868,910  9/1989  Maulding ........................... 324/233
5,155,431  10/1992  Holcomb ....................... 324/121 R Primary Examiner—Kenneth A. Wieder
Assistant Examiner—Kourosh Cyrus Khostravi
Attorney, Agent, or Firm—George T. Noe

[57] ABSTRACT

An analog-to-digital converter utilizes low-resolution and high-resolution conversion paths for precision voltage measurements. A first conversion made using a comparatively low resolution ADC is used to predict the reference voltage to one input of a null detector that receives the input voltage on another input, and effectively magnifies the voltage difference between its inputs. In a preferred embodiment, the duty cycle of a pulse-width modulator is adjusted to precisely adjust the reference voltage to provide a nulled (or near null) reading from the null detector. A low resolution ADC then converts the voltage from the null detector, which when added to the reference voltage, yields a final reading with 18-bit to 22-bit accuracy. The preferred embodiment is implemented to read the output from a pressure transducer and employs a binary search technique to rapidly adjust the duty cycle of the pulse-width modulator. The system utilizes a single ADC which is multiplexed between the low-resolution, high-speed reading and high-resolution, low-speed reading of the fully settled output of the null detector.

8 Claims, 3 Drawing Sheets

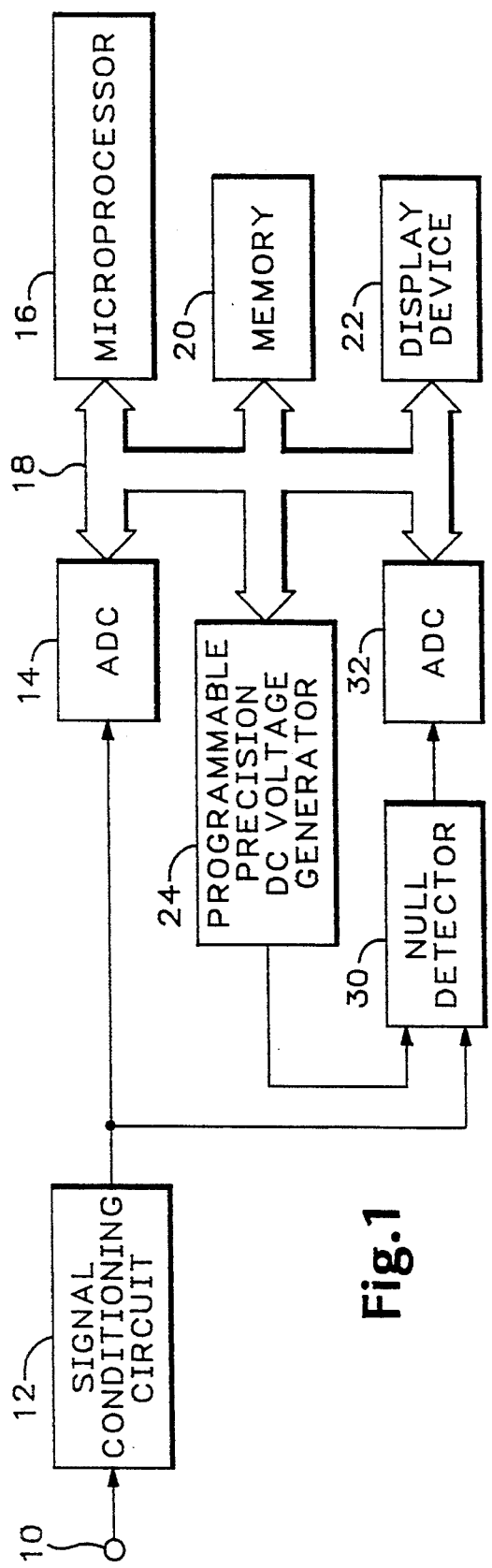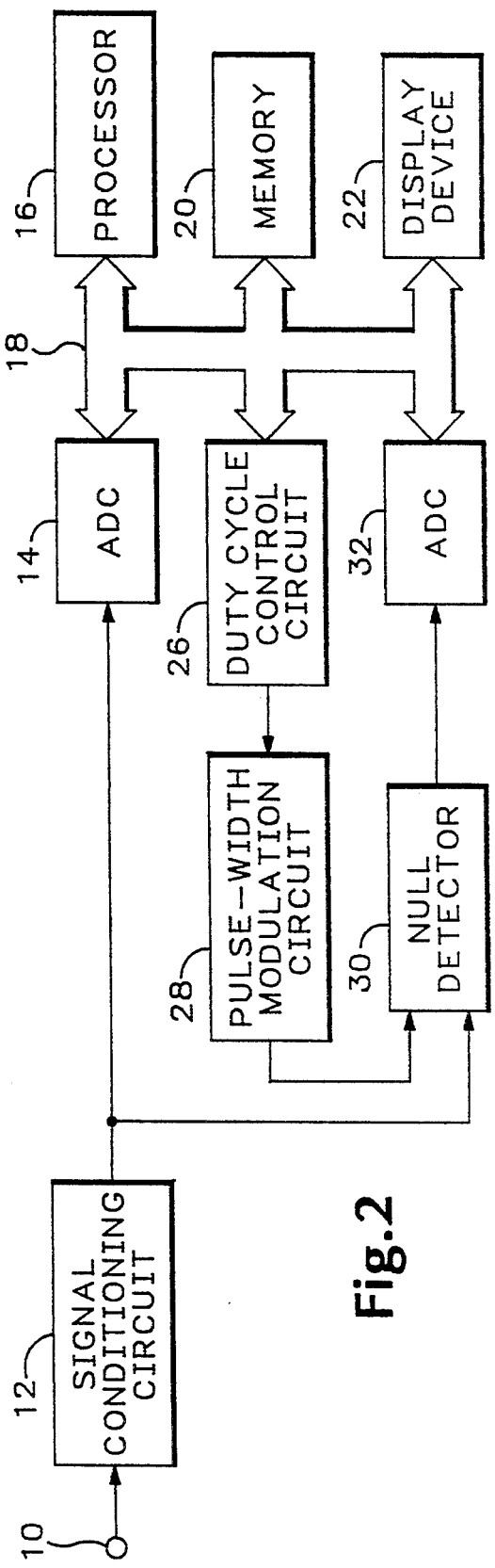

PRECISION ANALOG-TO-DIGITAL CONVERTER WITH LOW-RESOLUTION AND HIGH-RESOLUTION CONVERSION PATHS

BACKGROUND OF THE INVENTION

This invention relates generally to analog-to-digital converters, and in particular to a precision analog-to-digital converter having low-resolution and high-resolution conversion paths.

There are many conventional analog-to-digital converters that are capable of measuring analog voltages with a high degree of precision. Most of these, however, are quite sophisticated, take up a great deal of space, consume a large amount of power, and are comparatively expensive. There are some measurement situations in which it would be desirable to provide a high-resolution analog-to-digital converter using relatively simple and inexpensive parts, and capable of implementation in a small area. One such situation, for example, is measurement of low-level signals from transducers, such as pressure transducers and the like, wherein it is desired to place a high-resolution analog-to-digital converter in a small module near the transducer and remote from the measuring instrument.

SUMMARY OF THE INVENTION

In accordance with the present invention, a simple, compact, and low-cost analog-to-digital converter utilizes low-resolution and high-resolution conversion paths for precision voltage measurements.

A comparatively low-resolution (e.g., 4 bits or 8 bits) analog-to-digital converter (ADC) first converts an input signal to digital form to provide a first measurement. The first converted voltage for a 4-bit ADC is within 6.25% of the actual value of the input signal; for an 8-bit ADC, the converted voltage is within 0.4% of the actual value of the input signal. This value is utilized to establish the output DC voltage of a programmable precision DC voltage source, which DC voltage is applied to one input of a high-gain operational amplifier operated as a null detector, while the input signal is applied to the other input thereof. The sensitivity of the null detector is such that its output will be locked to one of its dynamic operating range limits, or saturated, if the voltage difference at its two inputs exceeds a predetermined voltage. In a preferred embodiment, a microprocessor stores the first-converted value, and then, using an 8-bit ADC, controls the duty cycle of a square-wave voltage signal that is applied to a low-pass filter to produce a pulse-width modulated direct-current (DC) voltage. That is, the precision DC voltage source produces a pulse-width-modulated DC voltage for application to one input of the high-gain operational amplifier. The gain of the operational amplifier is 500 so that the sensitivity is 20 millivolts for a 10-volt output swing (+5 V to −5 V).

Initially, the null detector is saturated, and its output voltage is clamped to a positive or negative supply voltage rail. The duty cycle of the switching signals is altered by the microprocessor to change the pulse-width modulated DC voltage until it is sufficiently close to the input signal to bring the null detector out of saturation and bring its output voltage within the dynamic operating range of the operational amplifier.

A binary search technique may be employed to adjust the duty cycle to locate a pulse-width modulated voltage which will either cause the null detector to come out of saturation or will be sufficiently close that a slight alteration in the duty cycle may be made to cause the null detector to come out of saturation. Alternatively, the first-converted value can be utilized to program a programmable counter to establish an initial duty cycle that can subsequently be varied one bit at a time until a pulse-width modulated voltage that causes the null detector to come out of saturation is reached. The first-converted value may be used to predict what the pulse-width modulated DC voltage should be so that the time taken to get the high-resolution measurement is slightly longer than the settling time of the pulse-width modulation circuit. Thus, the null detector comes out of saturation almost as soon as a pulse-width modulated DC voltage is developed, or after a few duty cycle adjustments, and output voltage thereof then may be converted to digital form to provide a second measurement, again using a low-resolution analog-to-digital converter. The output voltage of the null detector for the second measurement is between 0% and 0.4% of the input signal value when measured with an eight-bit analog-to-digital converter, as it was for the first measurement, and when added to the first-converted value (or a modified first-converted value used to establish the final duty cycle), yields a final value measured with an effective resolution of 18 to 22 bits of accuracy.

A preferred embodiment of the present invention is implemented in a measurement instrument for monitoring the analog voltage obtained from a commercially available pressure transducer. Signal conditioning is achieved using a precision instrumentation amplifier to match the output voltage range of the transducer with the measurement circuitry. A microprocessor including a simple 8-bit ADC is multiplexed between a low resolution (but high speed) reading and a fully settled reading of the null detector, which is rather slow, but produces 18 to 22 bits of accuracy. The low-resolution reading is displayed to a user via a display device to give an indication of the measured input signal if the input signal is too noisy for the slower conversion to converge. A complete converged measurement process takes about a half a second to yield a high-resolution output, and can automatically sample and update the readings on a periodic basis.

It is therefore one object of the present invention to provide a precision analog-to-digital converter having coarse and fine conversion paths.

It is another object of the present invention to provide a high performance sampling analog-to-digital converter having a high-speed, low resolution conversion path, and a low-speed, high resolution conversion path.

It is a further object of the present invention to provide an analog-to-digital converter which employs pulse-width modulation combined with a null detector to obtain a high degree of precision.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 1 is a generalized block diagram of an analog-to-digital converter in accordance with the present invention;

FIG. 2 is a block diagram of a preferred embodiment of the present invention;

DETAILED DESCRIPTION OF THE INVENTION

Figure 3A:
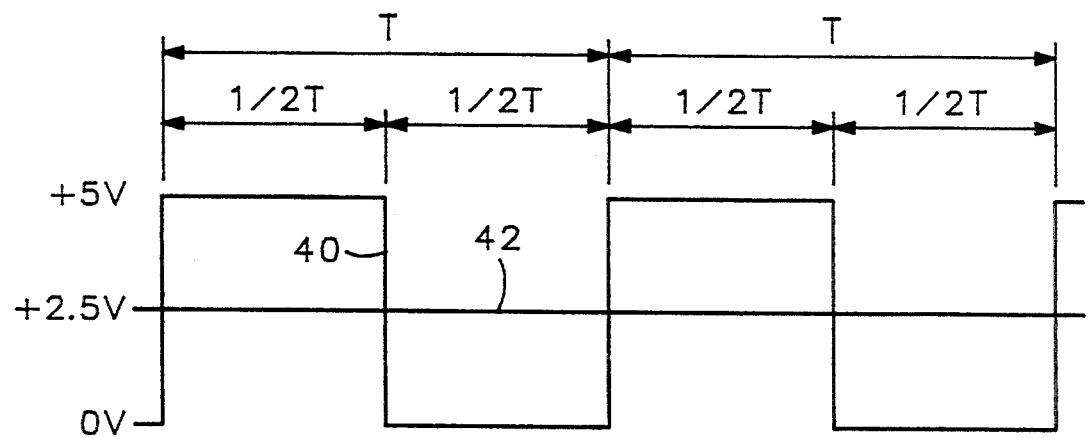
FIGS. 3A–3C are waveforms to explain the operation of the pulse-width modulation technique employed by the preferred embodiment of the present invention.

Referring to FIG. 1 of the drawings, a generalized block diagram of an analog-to-digital converter (ADC) in accordance with the present invention is shown in which an input analog voltage to be measured is applied via an input terminal 10 to a signal conditioning circuit 12. Signal conditioning circuit 12 may be any conventional amplifier or attenuator, or a combination thereof, to condition and scale the input signal voltage to a suitable level for measurement within the conversion window or input range of the ADC.

The conditioned input voltage is applied to a comparatively low-resolution ADC 14, where it is converted to a digital representation. ADC 14 may be a simple 4-bit or 8-bit converter for first converting the input voltage to digital form to provide a first-converted voltage measurement. The first converted voltage for a 4-bit ADC is within 6.25% of the actual value of the input voltage; for an 8-bit ADC, the converted voltage is within 0.4% of the actual value of the input voltage.

A microprocessor 16 reads the output of ADC 14 and transports the digital representation of the amplitude, plus polarity sign, over a conventional microprocessor bus structure 18 to a memory device 20, which may suitably include a random-access memory (RAM) as well as a read-only memory (ROM) for storing programmed instructions, and to a display device 22, where it is immediately available to a user. Display device 22 may be any of a number of conventional display devices, such as a flat panel liquid crystal display (LCD) or the like.

Microprocessor 16 also initiates a programmable precision DC voltage generator 24, which may suitably be any of a number of well known programmable voltage sources, such as a digital-to-analog converter. The digital representation of the input voltage may be used by microprocessor 16 to initiate the voltage generator 24 to immediately produce a DC voltage near the input voltage being measured. The DC voltage is applied to one input of a null detector 30, which may be a high-gain operational amplifier, while the input signal is applied to the other input thereof. The output of null detector 30 is applied to a second ADC 32, which may be identical to ADC 14.

Initially, the null detector 30 is saturated, and its output voltage is clamped to a positive or negative supply voltage rail, such as +5 volts and −5 volts, which are the limits of its dynamic operating range. Microprocessor 16 reads the output of ADC 32, which indicates the saturated state of null detector 30, and alters the programming data applied over bus 18 to the precision DC voltage generator to change the DC voltage applied to null detector 30 until it is sufficiently close to the input voltage to bring null detector 30 out of saturation and bring its output voltage within the dynamic operating range of the operational amplifier.

Microprocessor 16 detects the unsaturated state of null detector 30 via ADC 32 and reads the second converted digital representation. The gain of the operational amplifier in null detector 30 may be such that the output voltage window provided by null detector 30 can interpolate between discrete conversion levels of ADC 14. This situation permits simply adding the second reading provided by ADC 32 to the first reading provided by ADC 14 to produce a final value. In any case, the programmed DC voltage, known to microprocessor 16 which caused such voltage to be generated, is added to the value measured by ADC 32 to provide a very precise representation of the unknown input voltage, with an effective resolution of 18 to 22 bits of accuracy. The final value then may be displayed to the user by display device 22. The final reading may take about a half a second to obtain, and can be updated on a periodic basis, for example, every second.

The first-converted value may be used to predict what the programmable DC voltage should be, and accordingly utilized to initialize the programmable precision DC voltage generator 24. Thereafter, a binary search technique may be employed to adjust the program data applied to voltage generator 24 to locate a DC voltage which will cause null detector 30 to come out of saturation. Alternatively, the program data be varied one bit at a time until a DC voltage that causes null detector 30 to come out of saturation is reached. Thus, null detector 30 comes out of saturation almost as soon as a DC voltage is developed, or after a few adjustments, and output voltage thereof then may be converted to digital form to provide a second conversion measurement, again using a low-resolution analog-to-digital converter. The output voltage of the null detector for the fine measurement is between 0% and 0.4% of the input signal value when measured with an eight-bit analog-to-digital converter, and when added to the first-converted value (or a modified first-converted value used to establish the final duty cycle), yields a final value measured with an effective resolution of 18 to 22 bits of accuracy.

A preferred embodiment of the present invention is shown in block diagram form in FIG. 2, wherein like reference numerals are used for like elements. Here, the precision DC voltage source 24 is replaced by a duty-cycle control circuit 26 which controls the duty cycle of a square-wave voltage signal that is applied to a low-pass filter in a pulse-width modulation circuit 28 to produce a pulse-width modulated direct-current (DC) voltage. The rest of the circuit elements operate substantially as described in connection with FIG. 1. Again, as discussed above in connection with FIG. 1, the digital representation of the input voltage may be used by microprocessor 16 to initiate the duty-cycle control circuit 24 to immediately approximate a pulse-width modulated DC voltage near the input voltage being measured. The pulse-width-modulated DC voltage is applied to one input of a high-gain operational amplifier of null detector 30, while the input signal is applied to the other input thereof. The null detector 30 operates as described above. The duty cycle of the switching signals is altered by the microprocessor 16 to change the pulse-width modulated DC voltage applied to null detector 30 until it is sufficiently close to the input voltage to bring null detector 30 out of saturation and bring its output voltage within the dynamic operating range of the operational amplifier.

The first-converted value may be used to predict what the pulse-width modulated DC voltage should be, and accordingly utilized to initialize the duty cycle. Thereafter, a binary search technique may be employed to adjust the duty cycle to locate a pulse-width modulated voltage which will cause null detector 30 to come out of saturation. Alternatively, the first-converted value can be utilized to program a programmable counter to establish an initial duty cycle that can subsequently be varied one bit at a time until a pulse-width modulated voltage that causes null detector 30 to come out of saturation is reached. In any case, the pulse-width modulated DC voltage can be adjusted very precisely and quickly by varying the duty cycle of the control signal. Thus, null detector 30 comes out of saturation almost as soon as a pulse-width modulated DC voltage is developed, or after a few duty cycle adjustments, and output voltage thereof then may be converted to digital form to provide a second conversion measurement, again using a low-resolution analog-to-digital converter. The output voltage of the null detector for the fine measurement is between 0% and 0.4% of the input signal value when measured with an eight-bit analog-to-digital converter, and when added to the first-converted value (or a modified first-converted value used to establish the final duty cycle), yields a final value measured with an effective resolution of 18 to 22 bits of accuracy.

Figure 3B:
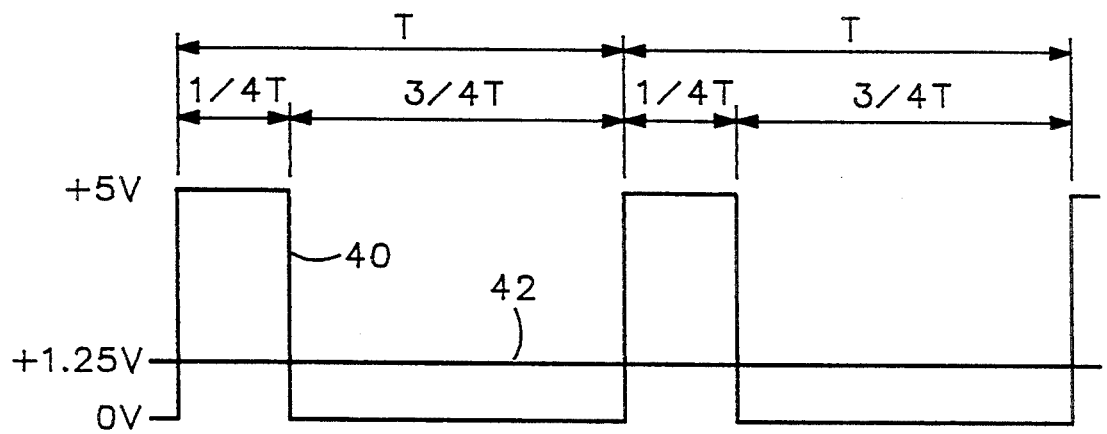
Figure 3C:
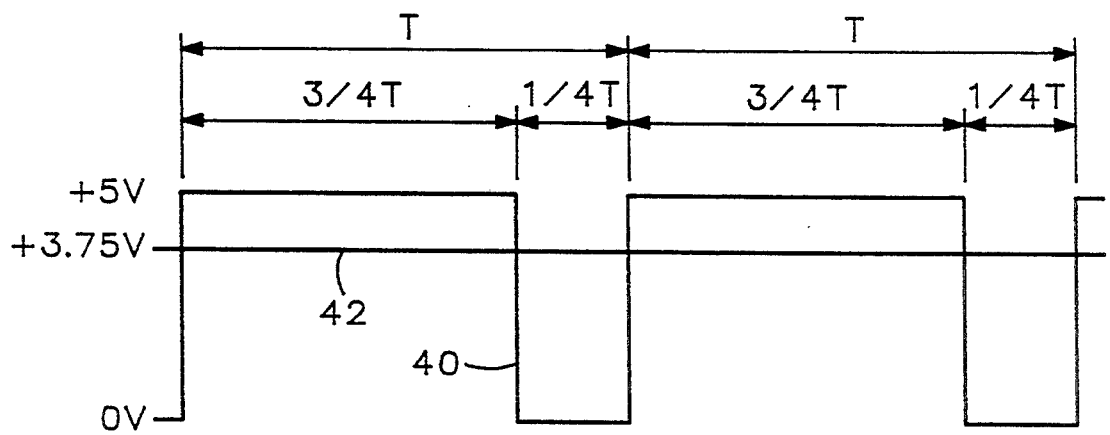

To gain an appreciation of how the pulse-width modulated DC voltage is developed by adjusting the duty cycle of a square-wave signal, refer to the waveform diagrams shown in FIGS. 3A through 2C. In FIG. 3A, a square-wave signal 40 is shown having an amplitude that varies from zero volts (0 V) to an exemplary reference voltage of five volts (+5 V), and has a duty cycle of 50%. That is, over one cycle indicated by time T, the square-wave voltage is at +5 V one-half of the time, or $\frac{1}{2}$T, and at 0 V one-half of the time, or $\frac{1}{2}$T. When filtered, a pulse-width modulated DC voltage level 42 is produced which is equal to one-half of the amplitude of the square-wave voltage, or +2.5 volts. In FIG. 3B, the duty cycle is adjusted to 25%, so that the square-wave signal voltage is at +5 V one-fourth of the time ($\frac{1}{4}$T) and at 0 V three-fourths of the time $\frac{3}{4}$), resulting in a pulse-width modulated DC voltage of +1.25 V. Similarly, in FIG. 3C, the duty cycle is adjusted to 75%, so that the square-wave signal voltage is at +5 V three-fourths of the time ($\frac{3}{4}$T) and at 0 V one-fourth of the time ($\frac{1}{4}$T), resulting in a pulse-width modulated DC voltage of +3.75 V. Thus, it can be discerned that the pulse-width modulated DC voltage 42 is proportional to the duty cycle of the control signal 40. For example, if a binary search sequence is used to adjust the pulse-width modulated DC voltage 42, the duty cycle may be first set to 50%, or to a percentage proportional to the value of the first reading by ADC 14, then the output of null detector 30 read to determine its state. Thereafter, the duty cycle can be adjusted to develop a pulse-width modulated DC voltage that converges toward the voltage of the input voltage in a well-known binary sequence $V \pm \frac{1}{2}V \pm \frac{1}{4}V \pm \frac{1}{8}V$,etc., until the output of the null detector 30 comes out of saturation. It should be pointed out that while a positive polarity is used in this example, the principles described herein are identical for negative-polarity voltages.

Figure 4:
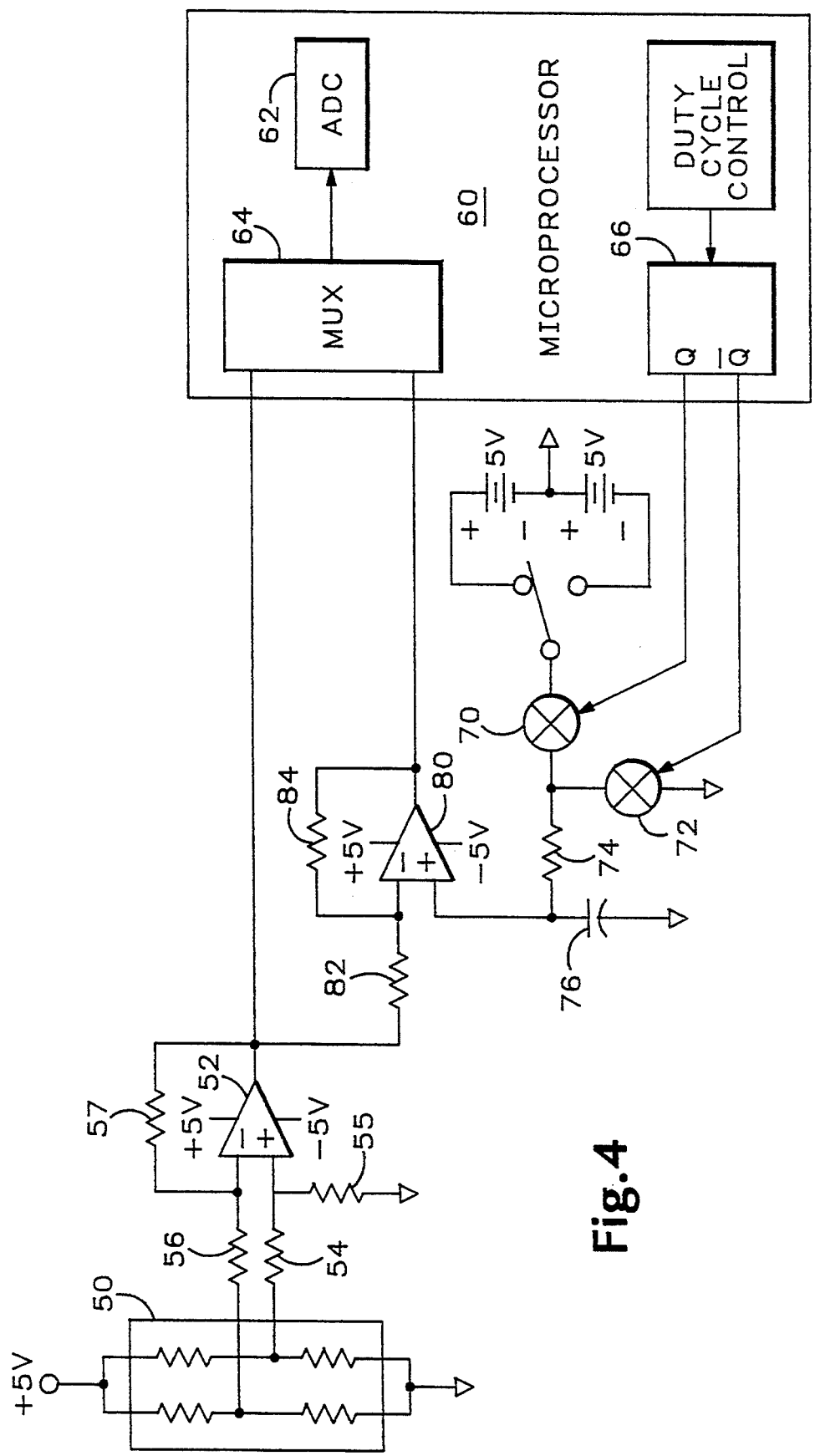
FIG. 4 is a schematic diagram of a preferred embodiment of the present invention.

FIG. 4 shows a preferred embodiment of the present invention as implemented to monitor the analog voltage from a commercially available pressure transducer; 50 connected between a reference voltage of +5 V and ground. Pressure transducer 50 may be monitoring air pressure in an air line, for example. As pressure varies, a differential voltage is developed across internal resistances and applied to a signal conditioning stage comprising a precision instrumentation amplifier 52. Instrumentation amplifier 52 is configured as an operational amplifier to match the output range of the transducer with the measurement circuitry to condition the input signal, and in this embodiment has an output dynamic range of +5 volts to −5 volts. Resistors 54–57 associated with instrumentation amplifier 52 in this embodiment were selected to provide a gain of 40 for the signal conditioning stage.

The output of instrumentation amplifier 52, which is a replication of the input voltage, is applied directly to a microprocessor 60, which couples the replicated input voltage to an internal 8-bit ADC 62 via a multiplexer 64. One microprocessor capable of performing the functions described herein is a Hitachi H8-327 microprocessor. A duty-cycle control circuit 66, which may suitably be a variable duty cycle flip flop, provides complementary control signals at a one-kilohertz rate to operate a pair of switches 70 and 72, which alternately connect one end of a resistor 74 to a precise +5 V or −5 V reference, depending on the polarity of the input voltage, and ground in order to generate a square wave voltage similar to that shown in FIGS. 2A–2C. Resistor 74 and capacitor 76 form a low-pass filter which effectively integrates the square-wave voltage to produce a pulse-width modulated DC voltage as described hereinabove.

The pulse-width modulated DC voltage generated by resistor 74 and capacitor 76 is applied to one input of an operation amplifier 80 that is operated as a null detector. The output of instrumentation amplifier 52 is coupled to a second input of operational amplifier 80 via an input resistor 82. A gain-setting feedback resistor 84 coupled from the output of operational amplifier 80 to its second input completes the null detector, and resistors 82 and 84 are selected to provide a gain of 500. Thus the sensitivity of the null detector is very high, and a 20 millivolt difference between the two inputs thereof will result in 10-volt change in the output. Since the output limits of the null detector are +5 volts and −5 volts, an input difference of greater than 20 millivolts will saturate the null detector and hold the output at one of the two extremes. The output of the null detector or operational amplifier 80 is coupled via mulitiplexer 64 to ADC 62. Thus, a single ADC 62 may be used for both the low-resolution, or first reading and, the high-resolution, or second reading. Otherwise, the overall circuit functions as described hereinabove, and microprocessor 60 including a simple 8-bit ADC 62 is multiplexed between a low resolution (but high speed) reading and a fully settled reading of the null detector, which is rather slow, but produces 18 to 22 bits of accuracy. The low-resolution reading is available immediately to a user via a display device to give an indication of the measured input signal while the slower conversion is taking place. The entire-process takes about a half a second to yield a high-resolution output, and the system can automatically sample and update the readings on a periodic basis.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as (my) our invention is:

1. A high-resolution voltage measurement circuit, comprising:
   an input path for receiving an input voltage to be measured;
   analog-to-digital conversion means coupled to said input path for converting said input voltage to a first converted voltage;
   a processor circuit coupled to an output of said analog-to-digital conversion means for receiving said first converted voltage;
   a programmable DC voltage generator coupled to said processor circuit to provide a DC reference voltage in response to commands from said processor circuit; and
   a null detector having a first input coupled to said input path and a second input coupled to an output of said programmable DC voltage generator, said null detector further having an output coupled to an input of said analog-to-digital conversion means,
   wherein said processor circuit monitors an output of said analog-to-digital conversion means while commanding said programmable DC voltage generator to adjust said DC reference voltage until the output of said null detector is within a predetermined range amplifying the difference between said input voltage and said DC reference voltage,
   said analog-to-digital conversion means further converting said difference between said input voltage and said DC reference voltage to a second converted voltage, and
   said processor circuit further adding said second converted voltage to a voltage equal to said DC reference voltage to provide a final voltage representative of said input voltage.

2. A voltage measurement circuit in accordance with claim 1 wherein said first converted voltage is used by said processor circuit to predict a value for said DC reference voltage.

3. A voltage measurement circuit in accordance with claim 1 wherein said processor circuit performs a binary search to establish a value for said DC reference voltage.

4. A voltage measurement circuit in accordance with claim 1 wherein said analog-to-digital conversion means is a single analog-to-digital converter multiplexed between said input path and said output of said null detector.

5. A voltage measurement circuit in accordance with claim 1 wherein said first converted voltage and said final voltage are provided to a display device.

6. A voltage measurement circuit in accordance with claim 1 wherein said programmable DC voltage generator is a pulse width modulation circuit which produces said DC reference voltage in response to a square-wave voltage signal, and further wherein said processor circuit varies the duty cycle of said square-wave voltage signal.

7. A voltage measurement circuit in accordance with claim 1 wherein said null detector is an operational amplifier having a predetermined gain.

8. A voltage measurement circuit in accordance with claim 1 wherein said analog-to-digital conversion means comprises a first analog-to-digital converter coupled to said input path and a second analog-to-digital converter coupled to the output of said null detector.

* * * * *